United States Patent [19]

Buchanan

[11] 4,334,204
[45] Jun. 8, 1982

[54] PROXIMITY SWITCH ASSEMBLY

[75] Inventor: John A. Buchanan, Renton, Wash.

[73] Assignee: The Boeing Company, Seattle, Wash.

[21] Appl. No.: 164,718

[22] Filed: Jun. 30, 1980

[51] Int. Cl.³ .......................................... H01H 36/00
[52] U.S. Cl. .................................. 335/205; 338/32 H
[58] Field of Search ...................... 335/205, 206, 207; 338/32 H, 32 R; 340/570, 545

[56] References Cited

U.S. PATENT DOCUMENTS

| | | | |
|---|---|---|---|
| 2,546,784 | 3/1951 | Roggenstein | 361/181 |
| 3,714,611 | 1/1973 | Madland | 335/2 |
| 3,718,877 | 2/1973 | Matsushima | 335/205 |
| 3,842,385 | 10/1974 | Ast et al. | 338/32 H |
| 4,213,110 | 7/1980 | Holce | 335/205 |

Primary Examiner—Harold Broome
Attorney, Agent, or Firm—James P. Hamley; Bernard A. Donahue

[57] ABSTRACT

A self contained switch assembly of the type indicating the status of a moveable mechanical structure, such as a door being in proper position for latching, includes a proximity sensor mounted to a base plate. Also mounted to the base plate is a plunger mechanism which carries a target plate. Upon the striker surface of the plunger engaging an external object, the target plate moves into proximity with the sensor, thereby producing a status signal.

1 Claim, 7 Drawing Figures

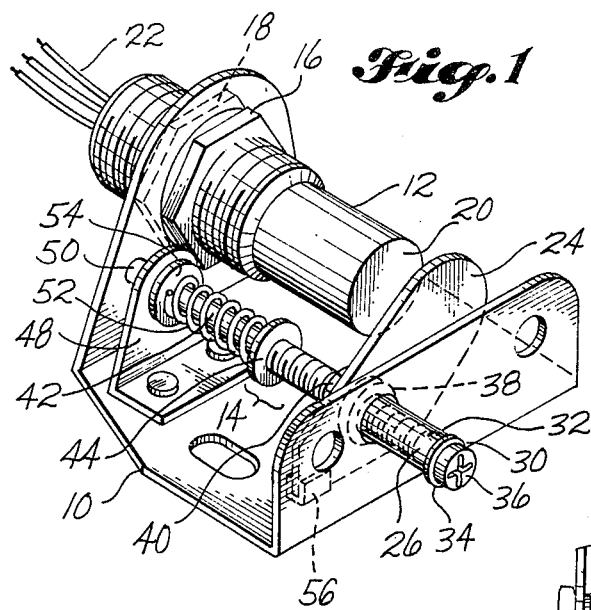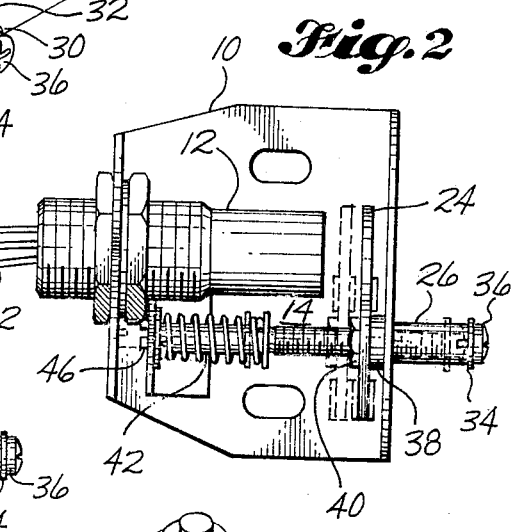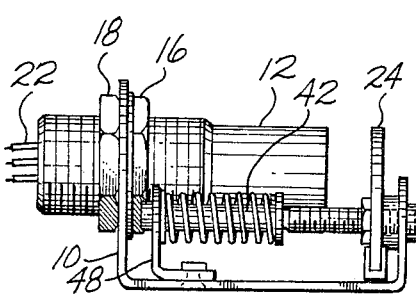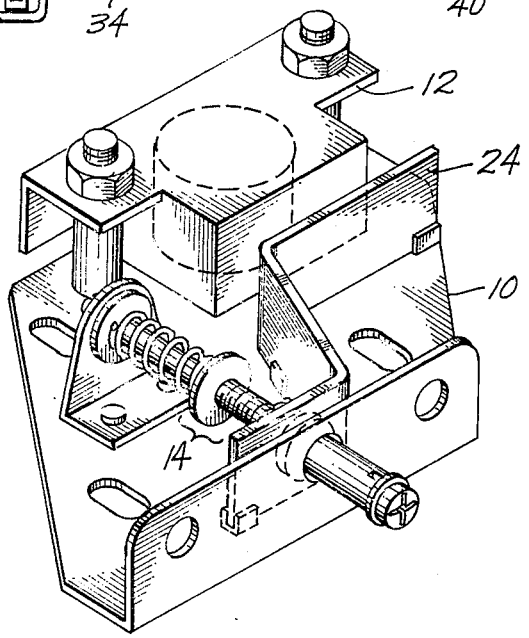

PROXIMITY SWITCH ASSEMBLY

BACKGROUND OF THE INVENTION

The present invention pertains to the electrical switch art and, more particularly, to an improved self contained proximity switch.

Numerous proximity switches have been developed in the prior art. Such switches are often positioned to sense the status of a moving object, such as a door. Thus, if the door is shut, a light is turned on or an indication is made that the door is secured.

In one type of prior art proximity switch, a plunger is depressed upon engaging the moving object. The plunger forces switch contacts to close causing associated circuitry to indicate proximity of the object.

In certain applications requiring proximity switches, the above mentioned force contact closing type switches are unsuitable. In one such application, proximity switches are positioned at the doorways of aircraft. Here, the switches are used to indicate to the flight deck the status of the various doors, i.e. that the doors are in position and locked. As it is crucial in aircraft applications that the switches work flawlessly over tens of thousands of operations, the above described forced contact switch proved unsuitable for reliability reasons.

Thus, a proximity sensor was developed which is capable of sensing the presence of a metallic object without the necessity of forcibly engaging the object. Such sensors could be placed in the proximity of doorways and, upon the door closing and coming within a predetermined distance of the sensor pickup, a signal is produced which is used by associated circuitry to indicate door proximity.

However, a failing in the above described proximity sensor is that for reliable operation it requires that a substantial area of some metallic object be brought within a specific tolerence of the pickup. In some applications, the object to be sensed does not present sufficient area for activating the sensor and/or the structural details of the mounting area provided for the sensor prevents proper alignment of the object therewith.

Thus, there has been a long felt need, particularly in the aircraft industry, for a highly reliable proximity switch which is adaptable to be configured in any of numerous different ways to allow mounting in the space provided.

SUMMARY OF THE INVENTION

It is an object of this invention, therefore, to provide a highly reliable proximity switch which may be configured in a variety of ways to accommodate mounting to structure.

It is a further object of the invention to provide the above described proximity switch which has convenient means for adjusting and aligning the various components thereof to adapt the switch for various purposes.

Briefly, according to the invention the proximity switch assembly comprises a base plate having a sensor mounted thereon. The sensor produces an output signal in response to a target plate being positioned within a predetermined distance of the pickup portion of the sensor. A plunger mechanism also mounts to the base plate and allows movement of a plunger with respect thereto in response to a plunger striker surface being forcibly engaged by an external object. A target plate mounts to the plunger for movement therewith and is positioned with respect to the sensor such that a predetermined movement of the plunger positions the target plate within the requisite predetermined distance of the sensor.

Preferably, the plunger has a provided threaded shaft and is mounted to the base plate such that it is free to rotate about its longitudinal axis. The target plate has provided means for mounting the plate to ride on the threaded shaft such that the static position of the target plate with respect to the sensor is adjustable by rotating the plunger.

BRIEF DESCRIPTION OF THE DRAWINGS

FIG. 1 is an isometric view of one embodiment of the proximity switch assembly;

FIG. 2 is a top plan view of the proximity switch shown in FIG. 1;

FIG. 3 is a side plan view of the proximity switch shown in FIG. 1;

FIG. 4 is an isometric view of an alternate embodiment of the proximity switch assembly;

DETAILED DESCRIPTION OF THE PREFERRED EMBODIMENTS OF THE INVENTION

Figure 5:
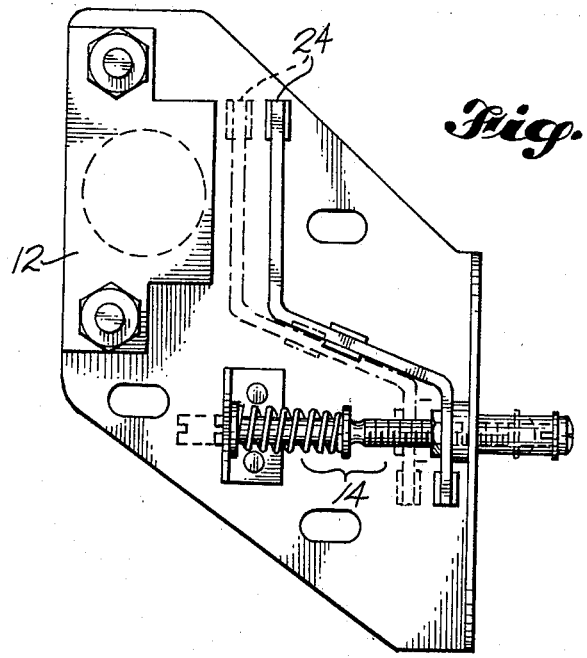
FIG. 5 is a top plan view of the embodiment shown in FIG. 4.

FIG. 1 is an isometric view of one embodiment of the proximity switch assembly. Mounted to a base plate, or bracket 10 is an electromagnetic sensor 12 and a plunger mechanism, indicated generally at 14.

The electromagnetic sensor 12 mounts to the base plate 10 via a pair of hex nuts 16, 18. The sensor has a face 20 containing a pickup (not shown). Extending from the rear of the sensor 12 are a series of wires 22 which route to associated circuitry.

Sensor 12 operates by producing an output signal on its wires 22 in response to a conductive material, such as a target plate being positioned within a predetermined distance from the pickup face 20. Such sensors are well known in the art and a commercial unit (P/N S283T006) is available from Eldec Corporation, Lynnwood, Wash.

Since the electromagnetic sensor 12 does not require mechanical abutting to produce its proximity signal, it has been found to be much more reliable in use than conventional forced contact type switches. In the past, such electromagnetic sensors were placed in the proximity of the object whose status, e.g. position, was to be sensed. A problem with such sensors has been, however, that in some applications it was not possible to assure that sufficient conductive material would come within the proximity of the pickup face to assure positive sensing of the sensor. Also, in some applications the surrounding structure to the object to be sensed did not permit the mounting of an electromagnetic sensor.

Thus, to overcome these aforementioned problems, the embodiment of the invention as shown in FIG. 1 employs a plunger mechanism 14 which carries a target plate 24. The plunger mechanism 14 is comprised of a plunger 26, which is a machined part. The plunger 26 has a striker surface 30 which, as is shown in FIG. 1, includes a screwdriver adjustment slot 32. Also shown in FIG. 1 is a washer 34 and a screw 36. The screw 36 is received in threads provided in the plunger 26 and serves the purpose of providing a hard striker surface as well as retaining the washer 34, and any other washers required, which provide a means to extend the length of the plunger 26.

The plunger 26 has a collar portion 38 which secures the plunger up against the face of bracket 10. The striker plate 24, which is a metallic sheet metal plate, mounts to plunger mechanism 14 and rides on a threaded shaft. Behind the striker plate 24 is a jam nut 40, which also screws onto the threads provided on the plunger mechanism 14.

The plunger 26 screws into an adjustment shaft 42. The adjustment shaft 42, which a machined part, is threaded into the plunger 26 and a suitable cement is used to lock the pieces 26, 42 together.

The adjusting shaft 42 has a collar 44 provided at one end and a screwdriver adjust slot 46 (see FIG. 2) provided at the remaining end. A bracket 48, which is mounted to the base plate 10, supports the plunger mechanism 14. A hole 50 is provided in the base plate 10 to allow screwdriver access to the slot in the slot adjust end 46 of adjusting rod 42.

A coil spring 52 is placed between the collar 44 on adjusting shaft 42 and a provided washer 54 which mounts against the bracket 48.

FIGS. 2 and 3 are top plan, and side plan views, respectively, of the proximity switch assembly shown in FIG. 1.

Operation of the system will be understood with reference to FIGS. 1 through 3, wherein FIG. 2 shows in dashed lines the activated position of the switch.

During installation, the base plate 10 is mounted, via the various mounting holes shown, to structure adjacent to the object whose position is to be sensed. The plunger mechanism 14 is adjusted such that when the external object is away from the proximity switch, the spring forces the plunger 26, and correspondingly the target plate 24 sufficiently away from the electromagnetic sensor 12 such that no output signal therefrom is produced. However, for the condition wherein the object is in proximity to the switch assembly, the plunger 26 is depressed by the object thereby moving the target 24 within a predetermined distance of the pickup face 20 of electromagnetic sensor thereby producing a proximity status signal carried out over wires 22.

A user may easily adjust the travel of the target plate 24 by rotating either the plunger 26 via its screwdriver slot 32 or the adjusting rod 42 via its screwdriver adjust end 46. In turning the mechanism 14, via either one of these screwdriver adjust slots, the target plate 24 rides back and forth on the plunger shaft until it is in a desired position. To prevent galling which might otherwise occur between the target plate 24 and base plate 10, nylon bushings, such as bushing 56 are secured to the target plate 24. Once the target plate is in its desired position, the adjusting nut 40 is secured against the target plate, thereby preventing further rotation of the mechanism and any translation of the target plate.

FIG. 4 illustrates an alternate embodiment of the proximity switch assembly. The basic features of the assembly are the same, that is it is provided with a base plate 10, a plunger mechanism 14, and an electromagnetic sensor 12, here shown as a rectangular type sensor.

In the FIG. 4 embodiment, however, the base plate 10 has been cut to fit a desired mounting space. To accommodate the dimensions of the mounting space, the sensor 12 has been located beside, and substantially behind the plunger mechanism 14. To compensate for this placement of the plunger mechanism 14 and sensor 20, the assembly includes an "S" shaped target plate 24. Otherwise, the system operates exactly as does the proximity switch shown in FIGS. 1-3.

Figure 6:
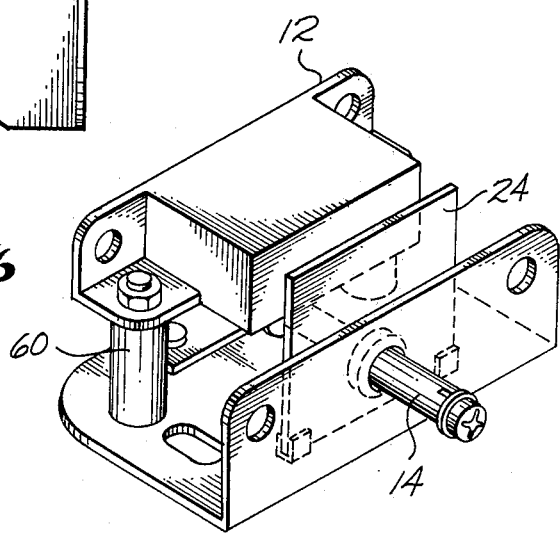
FIG. 6 is a further embodiment of the proximity switch assembly.

FIG. 6 is an isometric view of yet a further embodiment of the proximity switch assembly. Here, the sensor 12 is mounted on standoffs 60 such that it is above the plunger mechanism 14. Also, the target plate 24 is shaped to assure positive action of the electromagnetic sensor 12 during operation of the switch.

Figure 7:
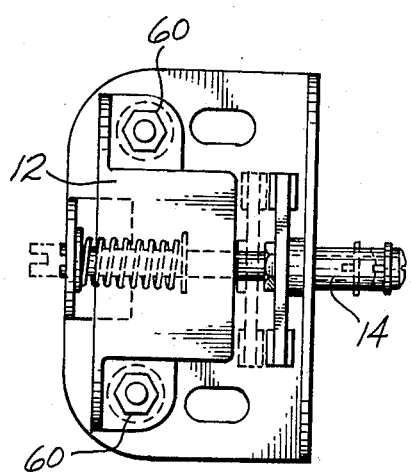
FIG. 7 is a top plan view of the proximity switch assembly shown in FIG. 6.

FIG. 7 is a top plan view of the proximity switch assembly embodiment shown in FIG. 6.

Operation of the embodiment shown in FIGS. 6 and 7 is otherwise identical to that shown in FIG. 1-3.

In summary, a highly reliable, self contained proximity switch assembly has been described in detail. The design of the switch renders it adaptable for mounting in virtually any desired space. Further, this switch mechanism is very easily adjusted to accommodate installation.

While preferred embodiments of the invention have been described in detail, it should be apparent that many modifications and variations thereto are possible, all of which fall within the true spirit and scope of the invention.

I claim:

1. A proximity switch assembly comprising:

a base plate;

a sensor mounted to the base plate and producing an output signal in response to a target plate being within a predetermined distance of the pickup portion of said sensor;

a plunger mechanism mounted to the base plate for movement of a plunger with respect thereto in response to a plunger striker surface being forcibly engaged by an external object;

a target plate mounted to the plunger for movement therewith and being positioned with respect to the sensor such that a predetermined movement of said plunger positions the target plate within said predetermined distance of said sensor; and wherein the plunger has a threaded shaft and is mounted to said base plate such that it is free to rotate about its longitudinal axis and the target plate has a provided means for mounting said target plate to ride on said threaded shaft such that the static position of the target plate with respect to the sensor is adjustable by rotating said plunger.

* * * * *